US012787753B2

(12) United States Patent
Zuo et al.

(10) Patent No.: US 12,787,753 B2
(45) Date of Patent: Nov. 3, 2026

(54) SEMICONDUCTOR DEVICE

(71) Applicants: Nexperia Technology (Shanghai) Ltd., Shanghai (CN); NEXPERIA B.V., Nijmegen (NL)

(72) Inventors: Huiling Zuo, Shanghai (CN); Chunlin Zhu, Shanghai (CN); Mark Gajda, Shanghai (CN); Ke Jiang, Shanghai (CN); Xukun Zhang, Shanghai (CN); Junli Xiang, Shanghai (CN); Jinshan Shi, Shanghai (CN); Yuan Fang, Shanghai (CN)

(73) Assignees: Nexperia Technology (Shanghai) Ltd., Shanghai (CN); NEXPERIA B.V., Nijmegen (NL)

( * ) Notice: Subject to any disclaimer, the term of this patent is extended or adjusted under 35 U.S.C. 154(b) by 369 days.

(21) Appl. No.: 18/533,460

(22) Filed: Dec. 8, 2023

(65) Prior Publication Data

US 2024/0194600 A1 Jun. 13, 2024

(30) Foreign Application Priority Data

Dec. 9, 2022 (CN) ........................ 202211581689.2

(51) Int. Cl.
*H10W 20/41* (2026.01)
*H10D 12/00* (2025.01)
(Continued)

(52) U.S. Cl.
CPC ........ *H10W 20/435* (2026.01); *H10D 12/411* (2025.01); *H10D 64/519* (2025.01); *H10D 84/645* (2025.01)

(58) Field of Classification Search
CPC ............. H10W 20/435; H10W 20/484; H10D 12/411; H10D 64/519; H10D 84/645; H10D 64/513; H10D 12/481
See application file for complete search history.

(56) References Cited

U.S. PATENT DOCUMENTS

2006/0157779 A1* 7/2006 Kachi ................ H10D 30/0295 257/E29.136
2013/0146972 A1* 6/2013 Rutter .................. H10D 12/481 257/334

(Continued)

FOREIGN PATENT DOCUMENTS

CN 114220853 A 3/2022

OTHER PUBLICATIONS

Machine translation of Yao et al. (CN-114220853) (Year: 2022).*

*Primary Examiner* — Yasser A Abdelaziez
(74) *Attorney, Agent, or Firm* — Ruggiero McAllister & McMahon LLC

(57) ABSTRACT

A semiconductor device having cells is provided, with each cell including a gate. The device includes a gate pad, a gate busbar and gate lines. The busbar connects the gate pad to the gate lines, the gate lines connect the gate busbar to the gates of the cells, and each of the gate lines is disposed along a first axis. The gate busbar includes first portions each disposed along a second axis, and the second axis intersects with the first axis. The first portions are spaced apart from each other to divide the semiconductor device into emitter segments. Lengths of the emitter segments along the first axis changes with distances of the segments from the gate pad, so that gate signals arriving at the gates of the cells from the gate pad via the gate busbar and the gate lines are substantially consistent.

18 Claims, 11 Drawing Sheets

(51) Int. Cl.
*H10D 64/27* (2025.01)
*H10D 84/60* (2025.01)

(56) References Cited

U.S. PATENT DOCUMENTS

| | | | | |
|---|---|---|---|---|
| 2015/0372087 | A1* | 12/2015 | Fachmann | H10D 12/032 |
| | | | | 257/329 |
| 2017/0278957 | A1 | 9/2017 | Hikasa | |
| 2022/0278212 | A1* | 9/2022 | Ryu | H10D 30/665 |

* cited by examiner

SEMICONDUCTOR DEVICE

CROSS-REFERENCE TO RELATED APPLICATIONS

This application claims the benefit under 35 U.S.C. § 119(a) of Chinese Patent Application No. 202211581689.2 filed Dec. 9, 2022, the contents of which are incorporated by reference herein in their entirety.

BACKGROUND

1. Field of the Disclosure

The present disclosure is related to the field of semiconductor technology, and particularly to a semiconductor device including a gate busbar.

2. Description of the Related Art

A power semiconductor device, such as an Insulated Gate Bipolar Transistor (IGBT), includes a plurality of cells connected in parallel. An IGBT has three electrodes being gate, emitter and collector. The emitter and the gate are located on the front side of the chip, while the collector is located on the backside of the chip. Gate signals from an external circuit are applied to the gate pad and then transmitted to the gates of the respective cells through the gate busbar, thereby controlling the turn-on of each cell.

With the increasing demand of high power and high frequency applications in the field of power semiconductor devices, sizes of the power chips become bigger and bigger, and a power chip contains more and more cells connected in parallel. The parasitic parameters of the gate busbar could not be ignored, which increases the delay of the gate signals received by the cells away from the gate pad, and further results in uneven current distribution, especially under high frequency applications.

CN114220853A disclosed that current sharing of the cells is realized by designing the width of the annular gate busbar located in the peripheral area of the power chip. Specifically, the farther the annular gate busbar was from the gate pad, the smaller the width of the annular gate busbar became. The solution therein only considered the width of the annular gate busbar located in the peripheral area of the power chip and provides only one width design solution for the annular gate busbar, which has very limited effect in solving the current sharing problem of the cells.

SUMMARY

The present disclosure provides a semiconductor device having emitter segments with non-uniform lengths and a gate busbar with non-uniform widths or thicknesses to ensure that each cell could receive a relatively consistent gate signal.

The semiconductor device according to the present disclosure includes a plurality of cells, each of the plurality of cells includes a gate. The semiconductor device includes a gate pad, a gate busbar and a plurality of gate lines, the gate busbar connects the gate pad to the plurality of gate lines, the plurality of gate lines connects the gate busbar to the gates of the plurality of cells, each of the plurality of gate lines is disposed along a first axis. The gate busbar includes a plurality of first portions each disposed along a second axis, the second axis intersects with the first axis, the plurality of first portions are spaced apart from each other to divide the semiconductor device into a plurality of emitter segments. Lengths of the plurality of emitter segments along the first axis change with distances of the plurality of emitter segments from the gate pad, such that gate signals arriving at the gates of the plurality of cells from the gate pad via the gate busbar and the plurality of gate lines are consistent.

In an embodiment of the present disclosure, the gate pad is disposed on a first portion of the plurality of first portions along the second axis, the gate busbar further includes a plurality of second portions each disposed along the first axis, the plurality of second portions include a first group of second portions disposed on a first side edge of the semiconductor device and connected in sequence, and a second group of second portions disposed on a second side edge of the semiconductor device and connected in sequence, the plurality of first portions are connected between the first group of second portions and the second group of second portions, and widths or thicknesses of the plurality of first portions are different from each other.

In an embodiment of the present disclosure, widths or thicknesses of the plurality of first portions gradually decrease in a first direction, the first direction parallels to the first axis and points toward a side away from the gate pad, widths or thicknesses of the plurality of second portions gradually decrease in the first direction, and lengths of the plurality of emitter segments along the first axis gradually decrease in the first direction.

In an embodiment of the present disclosure, an end of each of the plurality of second portions away from the gate pad is connected to a corresponding one of the plurality of first portions, a width of each of the plurality of second portions is equal to a sum of a width of a first portion connected to an end of the second portion away from the gate pad and a width of another second portion connected to the end of the second portion away from the gate pad.

In an embodiment of the present disclosure, widths or thicknesses of the plurality of first portions gradually increase in a first direction, the first direction parallels to the first axis and points toward a side away from the gate pad, widths or thicknesses of the plurality of second portions gradually increase in the first direction, and lengths of the plurality of emitter segments along the first axis gradually increase in the first direction.

In an embodiment of the present disclosure, widths or thicknesses of the plurality of first portions first increase and then decrease in a first direction, the first direction parallels to the first axis and points toward a side away from the gate pad, widths or thicknesses of the plurality of second portions first increase and then decrease in the first direction, and lengths of the plurality of emitter segments along the first axis first increase and then decrease in the first direction.

In an embodiment of the present disclosure, widths or thicknesses of the plurality of first portions first decrease and then increase in a first direction, the first direction parallels to the first axis and points toward a side away from the gate pad, widths or thicknesses of the plurality of second portions first decrease and then increase in the first direction, and lengths of the plurality of emitter segments along the first axis first decrease and then increase in the first direction.

In an embodiment of the present disclosure, at least one of the plurality of first portions is provided with an opening.

In an embodiment of the present disclosure, each of the plurality of first portions is provided with an opening.

In an embodiment of the present disclosure, the gate pad is located at a corner of the semiconductor device, and the opening is located at a corner opposite to the gate pad.

In an embodiment of the present disclosure, the gate pad is disposed on one first portion of the plurality of first portions along the first axis, the gate busbar further includes a plurality of second portions each disposed along the first axis, and the plurality of second portions connect the first portions of the plurality of first portions to the gate pad except the one first portion, and widths or thicknesses of the plurality of first portions are different from each other.

In an embodiment of the present disclosure, widths or thicknesses of the plurality of first portions gradually decrease in a first direction, the first direction points from the gate pad toward a side away from the gate pad along the first axis, widths or thicknesses of the plurality of second portions gradually decrease in the first direction, and lengths of the plurality of emitter segments along the first axis gradually decrease in the first direction.

In an embodiment of the present disclosure, an end of each of the plurality of second portions away from the gate pad is connected to a corresponding one of the plurality of first portions, a width or thickness of each of the plurality of second portions is equal to a sum of a width of a first portion connected to an end of the second portion away from the gate pad and a width of another second portion connected to the end of the second portion away from the gate pad.

In an embodiment of the present disclosure, widths or thicknesses of the plurality of first portions gradually increase in a first direction, the first direction parallels to the first axis and points toward a side away from the gate pad, widths or thicknesses of the plurality of second portions gradually increase in the first direction, and lengths of the plurality of emitter segments along the first axis gradually increase in the first direction.

In an embodiment of the present disclosure, widths or thicknesses of the plurality of first portions first increase and then decrease in a first direction, the first direction parallels to the first axis and points toward a side away from the gate pad, widths or thicknesses of the plurality of second portions first increase and then decrease in the first direction, and lengths of the plurality of emitter segments along the first axis first increase and then decrease in the first direction.

In an embodiment of the present disclosure, widths or thicknesses of the plurality of first portions first decrease and then increase in a first direction, the first direction parallels to the first axis and points toward a side away from the gate pad, widths or thicknesses of the plurality of second portions first decrease and then increase in the first direction, and lengths of the plurality of emitter segments along the first axis first decrease and then increase in the first direction.

In an embodiment of the present disclosure, the gate pad is disposed along the first axis, the gate busbar further includes a second portion disposed along the first axis, the second portion connects the first portions to the gate pad, each of the plurality of first portions includes a plurality of first sub-portions each disposed along the second axis and connected in sequence, and at least one of widths, thicknesses and lengths of the plurality of first sub-portions change along the second axis.

In an embodiment of the present disclosure, widths or thicknesses of the plurality of first sub-portions change in a second direction, the second direction parallels to the second axis and points toward a side away from the gate pad, and lengths of the plurality of first sub-portions change in the second direction, and the second portion has a uniform width along the first axis.

In an embodiment of the present disclosure, the widths or thicknesses of the plurality of first sub-portions gradually decrease in the second direction, and the lengths of the plurality of first sub-portions along the second axis gradually decrease in the second direction.

In an embodiment of the present disclosure, the widths or thicknesses of the plurality of first sub-portions gradually increase in the second direction, and the lengths of the plurality of first sub-portions along the second axis gradually increase in the second direction.

In an embodiment of the present disclosure, the widths or thicknesses of the plurality of first sub-portions first increase and then decrease in the second direction, and the lengths of the plurality of first sub-portions along the second axis first increase and then decrease in the second direction.

In an embodiment of the present disclosure, the widths or thicknesses of the plurality of first sub-portions first decrease and then increase in the second direction, and the lengths of the plurality of first sub-portions along the second axis first decrease and then increase in the second direction.

In an embodiment of the present disclosure, the gate pad is located in a middle region of the semiconductor device, the gate busbar further includes a third portion connected to ends of adjacent first portions at an edge of the semiconductor device, the third portion is disposed along the first axis, the plurality of emitter segments are defined by the plurality of first portions, the second portion and the third portion, and widths of the plurality of emitter segments along the second axis are different from each other.

In an embodiment of the present disclosure, the gate pad is located at a corner, in the middle of a side edge, or in a middle region of the semiconductor device.

In an embodiment of the present disclosure, the gate busbar further includes a third portion connected to ends of adjacent first portions at an edge of the semiconductor device, and the third portion is disposed along the first axis and is provided with an opening.

In an embodiment of the present disclosure, the plurality of emitter segments are isolated from each other.

DETAILED DESCRIPTION

Figure 1:
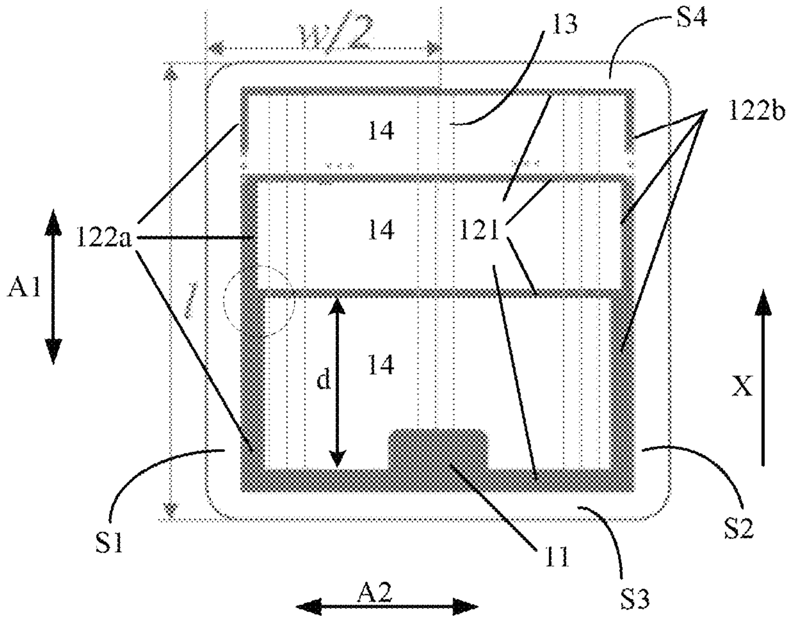
FIG. 1 is a schematic diagram of a semiconductor device according to a first embodiment of the present disclosure.

In order for a person skilled in the art to better understand the technical solutions of the present disclosure, as non-limiting examples, the semiconductor device provided by the present disclosure will be described in detail below in conjunction with the accompanying drawings.

It should also be noted that for the purpose of describing these exemplary embodiments herein, the views will show general features of the methods and devices of the exemplary embodiments of the present disclosure. These views, however, are not drawn to scale and may not precisely reflect the features of any given embodiment, and should not be understood as defining or limiting the range of values or characteristics of the exemplary embodiments within the scope of the present disclosure.

The terms such as "having", "including", "comprising" and "containing" are open-ended, these terms indicate the existence of stated structures, elements or features, but do not preclude the existence of additional elements or features. The articles "a," "an" or "the" are intended to include both the plural and the singular, except where the context explicitly indicates otherwise.

The present disclosure proposes a semiconductor device having a plurality of cells, and the semiconductor device includes a gate busbar with a novel structure. As known, each cell of the semiconductor device includes a gate, an emitter and a collector. The semiconductor device further includes a gate pad and a plurality of gate lines connected to the gates of the plurality of cells along a first axis. The gate busbar connects the gate pad to the plurality of gate lines. The gate pad receives external gate signals, which are transmitted to the plurality of gate lines via the gate busbar, and then arrive at the gates of the respective cells. The gate busbar includes a plurality of first portions each disposed along a second axis. The plurality of first portions are connected to the plurality of gate lines, such that the arrangement direction of the plurality of first portions (i.e., the first axis) intersects with the arrangement direction of the plurality of gate lines (i.e., the second axis). The plurality of first portions are spaced apart from each other to divide the semiconductor device into a plurality of emitter segments. Lengths of the plurality of emitter segments along the first axis change with distances of the plurality of emitter segments from the gate pad, such that gate signals arriving at the gates of the plurality of cells from the gate pad via the gate busbar and the plurality of gate lines are consistent.

It should be noted that "the element(s) is/are disposed along the axis" described herein means that the length direction of the element(s) is parallel to the axis, the element (s) herein for example may include the gate pad, a part of the gate busbar, or the gate lines, etc., "gate signals arriving at the gates of the plurality of cells are substantially consistent" means that the difference between the gate signals arriving at the gates of the plurality of cells is within a predetermined range. For example, the maximum time for the gate signals to arrive at the respective emitter segments may be the same to ensure that cells in the plurality of emitter segments could be turned on at the same time.

The semiconductor device according to the present disclosure is not only suitable for the trench gate structure, but also suitable for the plane gate structure. In the case of the trench gate structure, the trench gate is disposed along the first axis. In the case of the plane gate structure, the plane gate is disposed along the first axis. The following embodiments are described in the context of the trench gate structure.

Generally, the gate busbar is made of a metal having relatively low resistivity, and the gates of the respective cells are made of polysilicon having relatively high resistivity. In the embodiments of the present disclosure, the material of the gate busbar may include metals and/or alloys such as Al, AlCu, and AlSiCu. In some embodiments, the gate busbar only includes a metal layer. In some embodiments, the gate busbar includes a polysilicon layer and a metal layer.

The semiconductor device of the present disclosure further includes an emitter pad and a collector pad. As an example, the emitter pad and the gate pad may be located on the front side of the semiconductor device, and the collector pad may be located on the backside of the semiconductor device. Other suitable arrangements are also possible to a person skilled in the art.

Further, the semiconductor device further includes a substrate. The cells, the gate pad, the emitter pad, the collector pad, the gate busbar and the gate lines of the semiconductor device are all formed on the substrate. The material of the substrate may be silicon, silicon carbide, gallium nitride or the like, which are not restricted in the present disclosure.

The semiconductor device of the present disclosure may be a power semiconductor device such as an IGBT, a MOSET, a BJT, an MCT, particularly suitable for large current chips. The power semiconductor device according to the present disclosure may be applied to the fields of electric vehicles, hybrid electric vehicles, on-board chargers, solar energy, welding, uninterruptible power supply, power factor correction, storage devices, and so on.

FIG. 1 is a schematic diagram of a semiconductor device according to a first embodiment of the present disclosure. As shown in FIG. 1, the semiconductor device includes a gate pad 11, a gate busbar 12 and a plurality of trench gates 13. The plurality of trench gates 13 connect the gates of a plurality of cells (not shown in FIG. 1) of the semiconductor device. Each of the plurality of trench gates 13 is disposed along a first axis A1. The gate busbar 12 includes a plurality of first portions 121 each disposed along a second axis A2. The plurality of first portions 121 are connected to the plurality of trench gates 13. The first axis A1 intersects with the second axis A2. The gate pad 11 is disposed along the second axis A2 and on one of the plurality of first portions 121. The semiconductor device has a first side edge S1 and a second side edge S2 that opposes each other, and a third side edge S3 and a fourth side edge S4 that are connected between the first side edge S1 and the second side edge S2 and opposes each other. The two outermost first portions (e.g., the topmost first portion 121 and the bottommost first portion 121 in FIG. 1) of the plurality of first portions 121 are disposed at the third side edge S3 and the fourth side edge S4, respectively. The gate busbar 12 further includes a plurality of second portions 122 disposed along the first axis A1. The plurality of second portions 122 include a first group of second portions **122*a* disposed along the first side edge S1 of the semiconductor device and connected in sequence, and a second group of second portions 122*b* disposed along the second side edge S2 of the semiconductor device and connected in sequence. The plurality of first portions 121 are connected between the first group of second portions 122*a* and the second group of second portions 122*b*. The plurality of first portions 121 are spaced apart from each other to divide the semiconductor device into a plurality of emitter segments 14**.

In FIG. 1, lengths d of the plurality of emitter segments 14 along the first axis A1 change with distances of the plurality of emitter segments 14 from the gate pad 11. The lengths of the plurality of emitter segments 14 along the first axis A1 may be different from each other. In addition, widths or thicknesses of the plurality of first portions 121 change with distances of the plurality of first portions 121 from the gate pad 11 and differ from each other, and widths or thicknesses of the plurality of second portions 122 change with distances of the plurality of second portions 122 from the gate pad 11 and differ from each other.

It should be noted that, widths and lengths of the first portions/the second portions respectively refer to widths and lengths of the first portions/the second portions in the surface (i.e. the front side) of the semiconductor device, and thicknesses of the first portions/the second portions refer to sizes of the first portions/the second portions in a thickness direction of the semiconductor device. It could be understood that for a liner element, its length is the size in its extension direction, its width is the size in a direction perpendicular to its extension direction, and the length is greater than the width. For example, in FIG. 1, width of the first portion 121 refers to the size of the first portion 121 along the first axis A1, width of the second portion 122 (including **122*a* and 122*b*) refers to the size of the second portion 122 along the second axis A2, and thickness of the first portion 121/second portion 122 refers to the size of the first portion 121/second portion 122 along an axis perpendicular to the first axis A1 and the second axis A2**.

In the embodiments of the present disclosure, the lengths of the emitter segments along the first axis and the width/thickness of the gate busbar are designed to ensure that each cell could receive a substantially consistent gate signal. The gate signal difference between the respective cells could be reduced, no matter how far the cells are from the gate pad, which improves the current sharing capability of the chip.

As shown in FIG. 1, the first axis A1 may be perpendicular to the second axis A2. The semiconductor device has a length l and a width w. In this embodiment, the length direction of the semiconductor device is parallel to the first axis A1, and the width direction of the semiconductor device is parallel to the second axis A2.

In an embodiment of the present disclosure, as shown in FIG. 1, in a first direction (e.g., a vertically upward direction X in FIG. 1) that parallels to the first axis and points toward a side away from the gate pad 11, widths or thicknesses of the plurality of first portions 121 gradually decrease, widths or thicknesses of the plurality of second portions 122 gradually decrease, and lengths of the plurality of emitter segments 14 along the first axis A1 gradually decrease.

Figure 2:
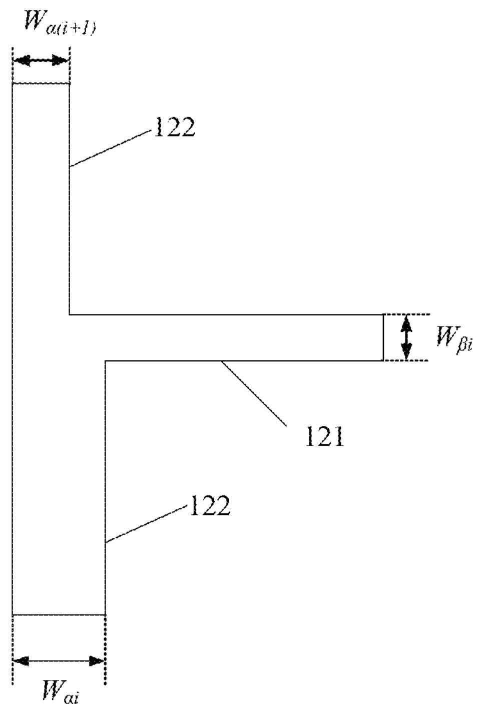
FIG. 2 is a partially enlarged view of an area of a gate busbar circled by dashed lines in FIG. 1.

In an embodiment of the present disclosure, an end of each of the second portions 122 away from the gate pad 11 is connected to a corresponding one of the first portions 121, and a width of each of the second portions 122 is equal to a sum of a width of a first portion 121 connected to an end of the second portion 122 away from the gate pad 11 and a width of another second portion 122 connected to the end of the second portion 122 away from the gate pad 11. FIG. 2 is a partially enlarged view of an area of the gate busbar circled by dashed lines in FIG. 1. As shown in FIG. 2, $W_{\alpha i}=W_{\alpha(i+1)}+W_{\beta i}$, where $W_{\alpha i}$ denotes a width of the $i^{th}$ second portion 122 in the first direction, $W_{\alpha(i+1)}$ denotes a width of the $(i+1)^{th}$ second portion 122 connected to an end of the $i^{th}$ second portion 122 away from the gate pad, and $W^{\beta i}$ denotes a width of the first portion 121 connected to the end of the $i^{th}$ second portion 122 away from the gate pad.

The implementation of the semiconductor device shown in FIG. 1 will be described in detail below.

Figure 3A:
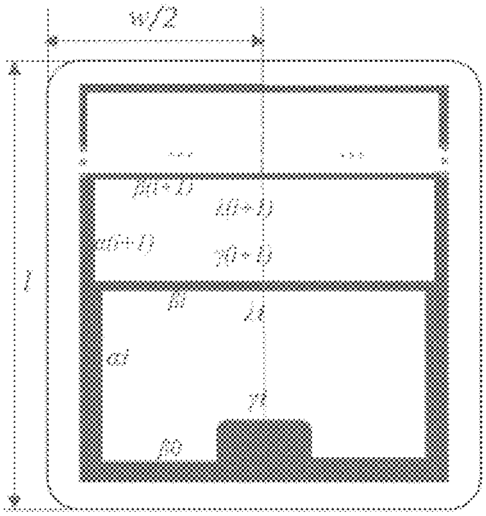
FIGS. 3*a* and 3*b* are equivalent circuit diagrams of the semiconductor device shown in FIG. 1.
Figure 3B:
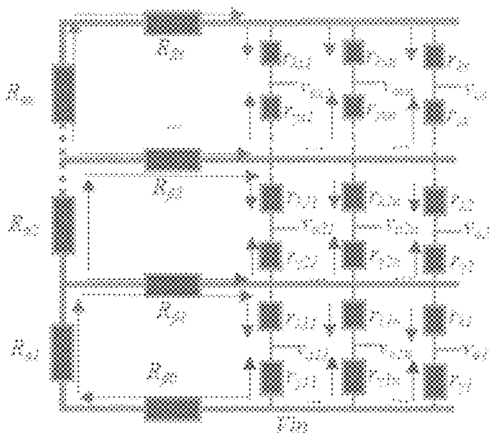

FIGS. **3*a* and 3*b* are equivalent circuit diagrams of the semiconductor device shown in FIG. 1. As shown in FIGS. 3*a* and 3*b***, in order to ensure that gate signals arriving at the gates of the respective cells are the same:

$$\text{when } i=1,\ V_{\gamma 1}=V_{\beta 0}+V_{\alpha 1}+V_{\beta 1}+V_{\lambda 1}, \text{ and}$$

$$\text{when } i>1,\ V_{\beta(i-1)}+V_{\gamma i}=V_{\alpha i}+V_{\beta i}+V_{\lambda i},$$

Where V denotes the voltage of the gate busbar, while v denotes the voltage of the trench gates. Specifically, $V_{\alpha i}$ denotes the voltage of the $i^{th}$ second portion in the first direction, $V_{\beta i}$ denotes the voltage of the first portion (i.e., the $i^{th}$ first portion) connected to an end of the $i^{th}$ second portion away from the gate pad, $v_{\lambda i}$ denotes the voltage of the trench gate from the $i^{th}$ first portion to the gate between the $i^{th}$ first portion and the $(i-1)^{th}$ first portion, and $v_{\gamma i}$ denotes the voltage of the trench gates from the $(i-1)^{th}$ first portion to the gate between the $(i-1)^{th}$ first portion and the $i^{th}$ first portion.

In the equivalent circuit diagram of FIG. **3*b***, the following conditions are satisfied:

$$\text{Voltage of the trench gate: } v_{\lambda i}=v_{\gamma(i+1)},$$

$$\text{Length: } L_{\lambda i}=L_{\gamma(+1)},\ L_{\gamma i}+L_{\lambda i}=L_{\alpha i},\ \Sigma L_{\alpha} i=l, L_{\beta i}=w/2,$$

$$\text{Gate busbar current: } I_{\alpha i}=I_{\alpha(i+1)}+I_{\beta i},$$

$$\text{Trench gate current: } i_{\lambda i}=I_{\gamma(i+1)}=I_{\beta i}/2/((w/2)/\text{pitch});$$

$$\text{Width: } W_{\alpha i}=W_{\alpha(i+1)}+W_{\beta i}.$$

Under the above conditions, if the design conditions $I>L_{\alpha i}>L_{a(i+1)}>=0$, $W_{\beta i}>W_{\beta(i+1)}$ are satisfied, the following results could be obtained:

taking three emitter segments (x=3) as an example, if $W_{\beta 3}>=5$ μm, $L_{\lambda x}=(0\sim I/x/2)$, the following could be obtained:

$$L_{\alpha 1}=(0.3\sim 1)*I,\ L_{\alpha 2}=(0\sim 0.4)*I,\ L_{\alpha 3}=(0\sim 0.3)*I,$$

$$W_{\alpha 1}=(3\sim 15)*W_{\beta 3},\ W_{\alpha 2}=(2\sim 8)*W_{\beta 3},\ W_{\alpha 3}=W_{\beta 3},$$

$$W_{\beta 0}=(3\sim 15)*W_{\beta 3},\ W_{\beta 1}=(1\sim 10)*W_{\beta 3},\ W_{\beta 2}=(1\sim 7)*W_{\beta 3}.$$

It could be understood that the resistance of the gate busbar (including the first portions and the second portions) may be adjusted by one of the width and thickness, and the length of the gate busbar, thereby reducing gate signal difference between the respective cells. For example, the gate busbar as a whole may have a constant width, but its thickness changes with distance of the gate busbar from the gate pad, and the lengths of the emitter segments along the first axis change with distances of the emitter segments from the gate pad. In this way, gate signal difference between the respective cells could be reduced, and the active region area could be further increased as well.

In an embodiment of the present disclosure, the first portions and second portions of the gate busbar may be formed simultaneously. In this way, no additional process step is needed. In the case where the material of the gate busbar is polysilicon and metal, the gate busbar is formed by depositing and etching polysilicon, and depositing and etching the front metal. In the case where the material of the gate busbar is metal only, the gate busbar is formed by depositing and etching the front metal.

Figure 4:
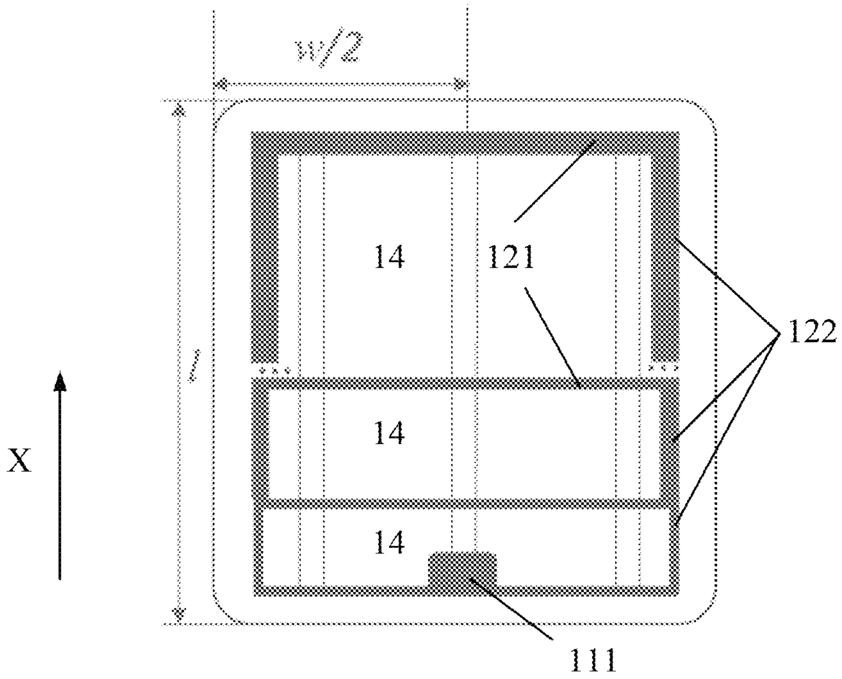
FIG. 4 is a schematic diagram of another semiconductor device according to the first embodiment of the present disclosure.

FIG. 4 is a schematic diagram of another semiconductor device according to the first embodiment of the present disclosure. As shown in FIG. 4, in a first direction X, widths or thicknesses of the plurality of first portions 121 gradually increase, widths or thicknesses of the plurality of second portions 122 gradually increase, and lengths of the plurality of emitter segments 14 along the first axis A1 gradually increase.

Figure 5A:
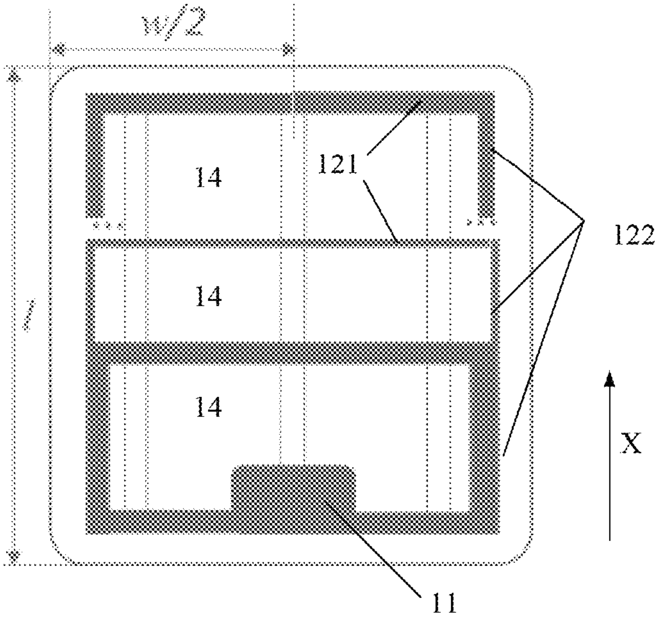
FIGS. 5*a* and 5*b* are schematic diagrams of another semiconductor device according to the first embodiment of the present disclosure.
Figure 5B:
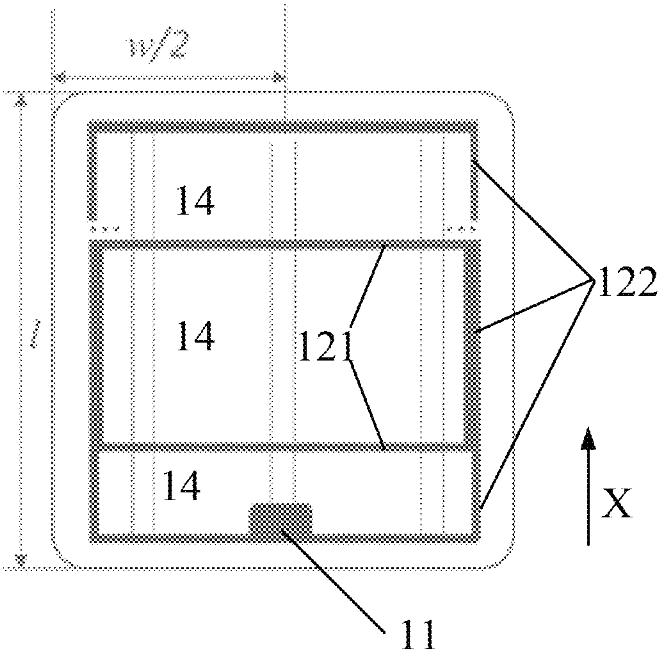

FIGS. 5*a* and 5*b* are schematic diagrams of another semiconductor device according to the first embodiment of the present disclosure. As shown in FIG. 5*a*, in the first direction X, widths or thicknesses of the plurality of first portions 121 first decrease and then increase, widths or thicknesses of the plurality of second portions 122 first decrease and then increase, and lengths of the plurality of emitter segments 14 along the first axis A1 first decrease and then increase. As shown in FIG. 5*b*, in the first direction X, widths or thicknesses of the plurality of first portions 121 first increase and then decrease, widths or thicknesses of the plurality of second portions 122 first increase and then decrease, and lengths of the plurality of emitter segments 14 along the first axis A1 first increase and then decrease.

Figure 6A:
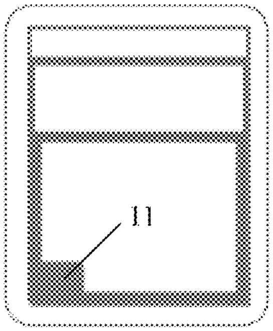
FIGS. 6*a*, 6*b* and 6*c* are schematic diagrams showing a gate pad of the semiconductor device according to the first embodiment of the present disclosure, the gate pad locates at different positions.
Figure 6B:
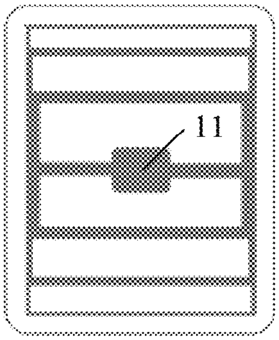
Figure 6C:
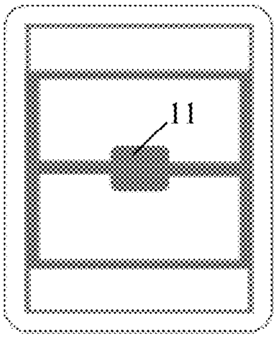

In FIGS. 1, 4, 5*a* and 5*b*, the gate pad 11 is disposed in the middle of a first portion 121 among the plurality of first portions 121 located at the third side edge S3 of the semiconductor device, that is, in the middle of the outermost (bottommost in FIGS. 1, 4, 5*a* and 5*b*) first portion 121 among the plurality of first portions 121. The present disclosure is not limited thereto. The gate pad 11 may also be disposed at a corner of the semiconductor device. As shown in FIG. 6*a*, the gate pad 11 is disposed at a corner of the semiconductor device, in connection with and in contact with the bottommost first portion and the bottom left second portion. As shown in FIG. 6*b*, the gate pad 11 is disposed in the middle of a first portion among the plurality of first portions located in a middle region of the semiconductor device. In this case, in a direction from the gate pad 11 to a side away from the gate pad 11 along the first axis (a direction upward and downward from the gate pad 11 in FIG. 6*b*), widths or thicknesses of the plurality of first portions, widths or thicknesses of the plurality of second portions, and lengths of the plurality of emitter segments along the first axis may gradually change. The position of the gate pad is not particularly limited in the present disclosure, and the gate pad may be flexibly disposed at a corner, in the middle of a side edge, or in a middle region of the semiconductor device, thus being compatible with various layout designs.

The cases where widths or thicknesses of the plurality of first portions, widths or thicknesses of the plurality of second portions, and lengths of the plurality of emitter segments along the first axis all change in the first direction are described above, but it could be understood that the present disclosure is not limited thereto. At least one of widths or thicknesses of the plurality of first portions, widths or thicknesses of the plurality of second portions, and lengths of the plurality of emitter segments along the first axis may be reasonably designed as long as the gate signals arriving at the gates of the plurality of cells are substantially consistent.

Furthermore, the number of the first portions of the gate busbar is not particularly limited in the present disclosure, and may be reasonably set according to actual needs.

Figure 7A:
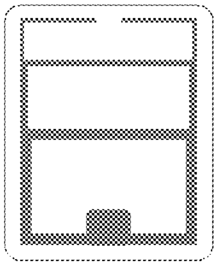
FIGS. 7*a*, 7*b*, 7*c* and 7*d* are schematic diagrams showing the first portion of the semiconductor device according to the first embodiment of the present disclosure that has an opening.

In FIGS. 1, 4, 5*a* and 5*b*, the gate busbar forms closed emitter segments. It could be understood that the first portion of the gate busbar may also be provided with an opening to facilitate interconnection between elements in different emitter segments, and between an element in the emitter segment and an element at the gate busbar's periphery (e.g., ground metal or zero potential field plate). For example, in the case where the ground metal is provided around the periphery of the gate busbar, as shown in FIG. 7*a*, an opening may be provided on the first portion farthest from the gate pad so that metals in the emitter segments are connected to the ground metal on the periphery of the gate busbar.

Figure 7B:
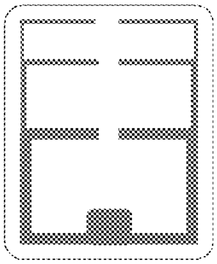

Within each of the emitter segments, emitters of the respective cells of the semiconductor device are disposed. The interconnection relationship between the emitters within different emitter segments is not particularly limited in the present disclosure. For example, emitters in adjacent emitter segments may be physically connected to each other such that the potentials of the respective emitter segments are substantially the same. The emitters are partially or fully connected, so that subsequent routing is simple. As shown in FIG. 7*b*, openings may be provided on the first portions between adjacent emitter segments to facilitate connection between the emitters within the adjacent emitter segments. It could be understood that, in the case of not providing openings on the first portions between the adjacent emitter segments, interconnection of the emitters within the adjacent emitter segments could also be achieved by subsequent routing. Of course, the emitters in different emitter segments could be independent of each other, without the need to provide openings on the gate busbar. It could be understood that in a packaged semiconductor device, the respective emitter segments are interconnected.

In some embodiments, an opening may be provided on each of the first portions of the gate busbar.

Figure 7C:
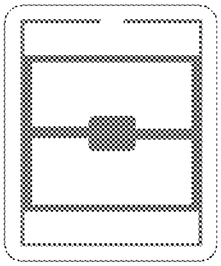
Figure 7D:
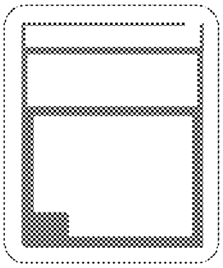

In the present disclosure, lengths and positions of the openings on the first portions of the gate busbar may be set according to actual needs. For example, as shown in FIGS. 7*a*, 7*b* and 7*c*, the gate pad is located in the middle of a first portion of the gate busbar, and the opening is located in another first portion other than the first portion where the gate pad is located, opposite to the location of the gate pad, i.e., the location of the gate pad is aligned with the location of the opening along the first axis. In another example, as shown in FIG. 7*d*, the gate pad is located at a corner of the semiconductor device, and the location of the opening is opposite to the location of the gate pad, i.e., the location of the gate pad is aligned with the location of the opening along a diagonal line of the semiconductor device. In this way, it could further ensure that the distances for the gates signal to arrive at the farthest gates are as consistent as possible.

Figure 8:
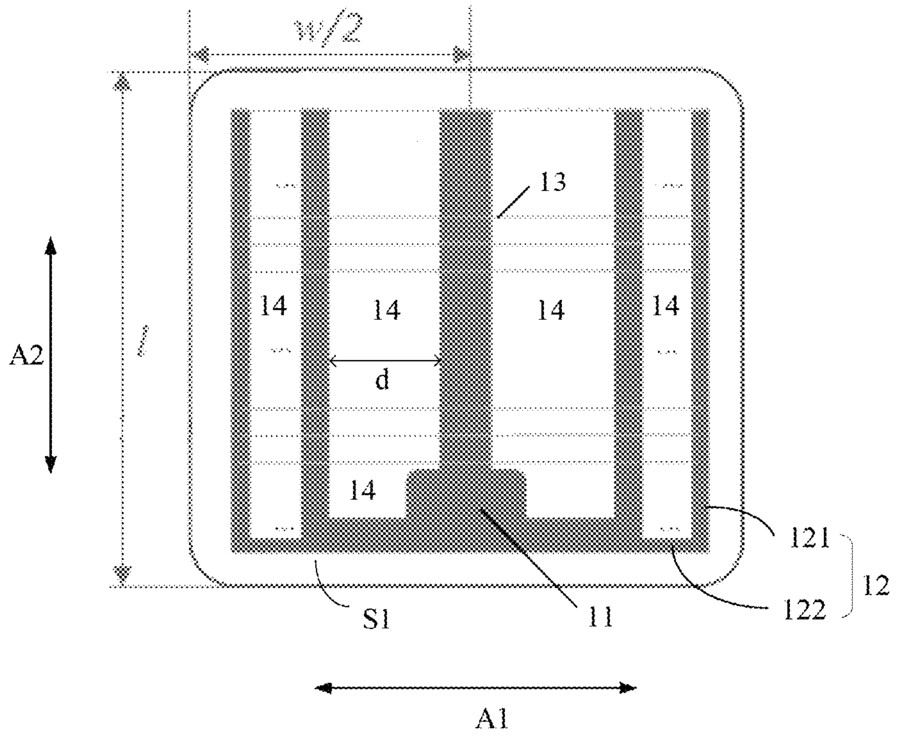
FIG. 8 is a schematic diagram of a semiconductor device according to a second embodiment of the present disclosure.

FIG. 8 is a schematic diagram of a semiconductor device according to a second embodiment of the present disclosure. As shown in FIG. 8, the semiconductor device includes a gate pad 11, a gate busbar 12 and a plurality of trench gates 13. The plurality of trench gates 13 connect gates (not shown) of a plurality of cells of the semiconductor device. Each of the trench gates 13 is disposed along a first axis A1. The gate busbar 12 includes a plurality of first portions 121 each disposed along a second axis A2. The plurality of first portions 121 are connected to the plurality of trench gates 13. The first axis A1 intersects with the second axis A2. Unlike the first embodiment shown in FIG. 1, the gate pad 11 is disposed along the first axis A1, in connection with and in contact with one of the plurality of first portions 121. The gate busbar 12 further includes a plurality of second portions 122 each disposed along the first axis A1. The plurality of second portions 122 connect the other first portions of the plurality of first portions 121 than the one in contact with the gate pad 11 to the gate pad 11. The plurality of first portions 121 are spaced apart from each other to divide the semiconductor device into a plurality of emitter segments 14.

In FIG. 8, lengths d of the plurality of emitter segments 14 along the first axis A1 change with distances of the plurality of emitter segments 14 from the gate pad 11. Lengths d of the plurality of emitter segments 14 along the first axis A1 may be different from each other. In addition, widths or thicknesses of the plurality of first portions 121 change with distances of the plurality of first portions 121 from the gate pad 11 and differ from each other, widths or thicknesses of the plurality of second portions 122 change with distances of the plurality of second portions 122 from the gate pad 11 and differ from each other. As shown in FIG. 8, lengths of the plurality of first portions 121 may be the same.

In FIG. 8, the width of the first portion 121 refers to the size of the first portion 121 along the first axis A1, the width of the second portion 122 refers to the size of the second portion 122 along the second axis A2, and the thickness of the first portion 121/second portion 122 refers to the size of the first portion 121/second portion 122 along an axis perpendicular to the first axis A1 and the second axis A2.

In the embodiments of the present disclosure, lengths of the emitter segments along the first axis and the width/thickness of the gate busbar (including the first portions and the second portions) are designed to ensure that each cell could receive a substantially consistent gate signal. The gate signal difference between the respective cells could be reduced, no matter how far the cells are from the gate pad, which improves the current sharing capability of the chip.

As shown in FIG. 8, the first axis A1 may be perpendicular to the second axis A2. The semiconductor device has a length I and a width w. In this embodiment, the length direction of the semiconductor device is parallel to the second axis A2, and the width direction of the semiconductor device is parallel to the first axis A1.

In an embodiment of the present disclosure, in a direction from the gate pad 11 to a side away from the gate pad 11 along the first axis A1 (i.e., in a first direction pointing from the gate pad 11 toward a side away from the gate pad 11 along the first axis A1), widths or thicknesses of the plurality of first portions 121 gradually decrease, widths or thicknesses of the plurality of second portions 122 gradually decrease, and lengths of the plurality of emitter segments 14 along the first axis A1 gradually decrease. In FIG. 8, staring from the gate pad 11 to the right along the first axis A1 and staring from the gate pad 11 to the left along the first axis A1, widths or thicknesses of the plurality of first portions 121 gradually decrease, widths or thicknesses of the plurality of second portions 122 gradually decrease, and the lengths of the plurality of emitter segments 14 along the first axis A1 gradually decrease.

In an embodiment of the present disclosure, an end of each of the second portions 122 away from the gate pad 11 is connected to a corresponding one of the first portions 121, a width of each of the second portions 122 is equal to a sum of a width of a first portion 121 connected to an end of the second portion 122 away from the gate pad 11 and a width of another second portion 122 connected to the end of the second portion 122 away from the gate pad 11. As shown in FIG. 8, $W_{\alpha i}=W_{\alpha(i+1)}+W_{\beta i}$, where $W_{\alpha i}$ denotes a width of the $i^{th}$ second portion in the first direction, $W_{\alpha(i+1)}$ denotes a width of the $(i+1)^{th}$ second portion connected to an end of the $i^{th}$ second portion away from the gate pad, and $W_{\beta i}$ denotes a width of the first portion connected to the end of the $i^{th}$ second portion away from the gate pad.

The implementation of the semiconductor device shown in FIG. 8 will be described in detail below.

Figure 9:
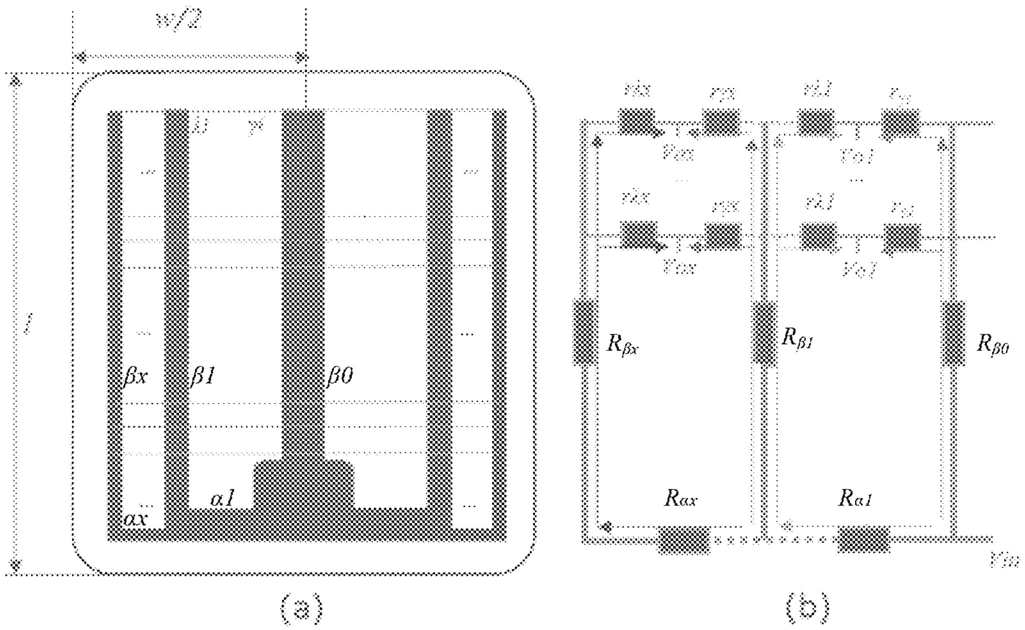
FIG. 9 is an equivalent circuit diagram of the semiconductor device shown in FIG. 8.

FIG. 9 is an equivalent circuit diagram of the semiconductor device shown in FIG. 8. As shown in FIG. 9, in order to ensure that gate signals arriving at the gates of the respective cells are the same:

$$V_{\beta i}+v_{\gamma(i+1)}=V_{\alpha(i+1)}+V_{\beta(i+1)}+v_{\lambda(i+1)},$$

Where V denotes the voltage of the gate busbar while v denotes the voltage of the trench gate. Specifically, $V_{\alpha(i+1)}$ denotes the voltage of the $(i+1)^{th}$ second portion in the first direction, $V_{\beta i}$ denotes the voltage of the first portion (i.e., the $i^{th}$ first portion) connected to an end of the $i^{th}$ second portion away from the gate pad, $V_{\gamma(+1)}$ denotes the voltage of the trench gate from the $i^{th}$ first portion to the gate between the $i^{th}$ first portion and the $(i+1)^{th}$ first portion, and $V_{\lambda(i+1)}$ denotes the voltage of the trench gate from the $(i+1)^{th}$ first portion to the gate between the $i^{th}$ first portion and the $(i+1)^{th}$ first portion.

In the equivalent circuit diagram of FIG. 9, the following conditions are satisfied:

voltage of the trench gate: $V_{\lambda i}=V_{\gamma(i+1)}$.

length: $L_{\lambda i}=L_{\gamma(i+1)}$, $L_{\gamma i}+L_{\lambda i}=L_{\alpha i}$, $\Sigma L_{\alpha i}=w/2$, $L_{\beta i}=I$, gate busbar current: $I_{\alpha i}=I_{\alpha(i+1)}+I_{\beta i}$, trench gate current: $I_{\lambda i}=I_{\gamma(i+1)}=I_{\beta i}/2/(I/\text{pitch})$, width: $W_{\alpha i}=W_{\alpha(i+1)}+W_{\beta i}$, Under the above conditions, if the design conditions $w/2>L_{\alpha i}>L_{\alpha(i+1)}>=0$, $W_{\beta i}>W_{\beta(i+1)}$ are satisfied, the following results could be obtained:

taking two emitter segments (x=2) as an example, if $W_{\beta 2}$>=5 μm, the following could be obtained:

$$W_{\beta 0}=(1\sim15)*W_{\beta 2},\ W\beta 1=(1\sim15)*W_{\beta 2},$$

$$L_{\alpha 1}=[(1/x)\sim1]*w/2,\ L_{\alpha 2}=[0\sim(1/x)]*w/2,$$

$$W_{\alpha 1}=(2\sim16)*W_{\beta 2},\ W_{\alpha 2}=W_{\beta 2}.$$

Figure 10:
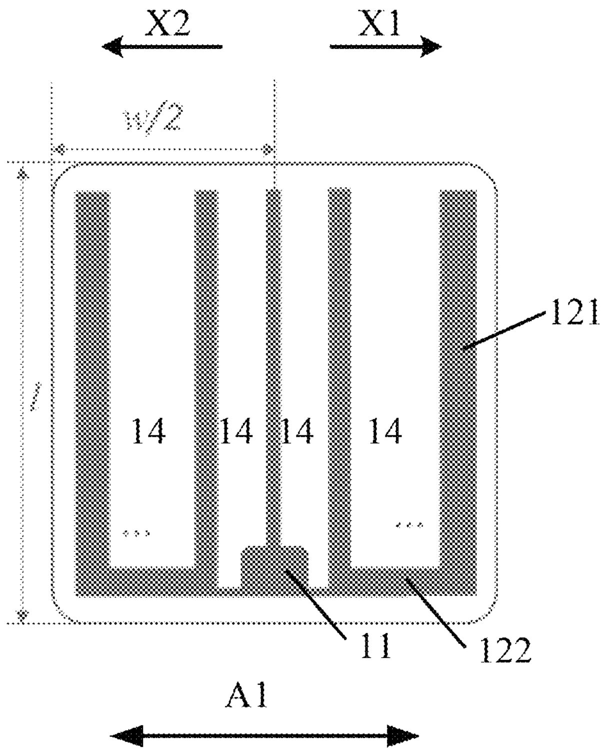
FIG. 10 is a schematic diagram of another semiconductor device according to the second embodiment of the present disclosure.

FIG. 10 is a schematic diagram of another semiconductor device according to the second embodiment of the present disclosure. As shown in FIG. 10, in first directions X1, X2 pointing from the gate pad 11 toward a side away from the gate pad along the first axis A1, widths or thicknesses of the plurality of first portions 121 gradually increase, widths or thicknesses of the plurality of second portions 122 gradually increase, and lengths of the plurality of emitter segments along the first axis A1 gradually increase.

Figure 11A:
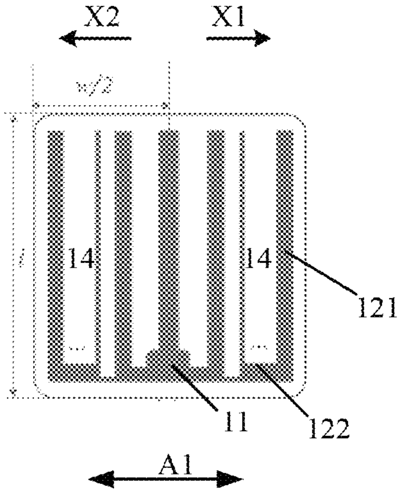
FIGS. 11*a* and 11*b* are schematic diagrams of another semiconductor device according to the second embodiment of the present disclosure.
Figure 11B:
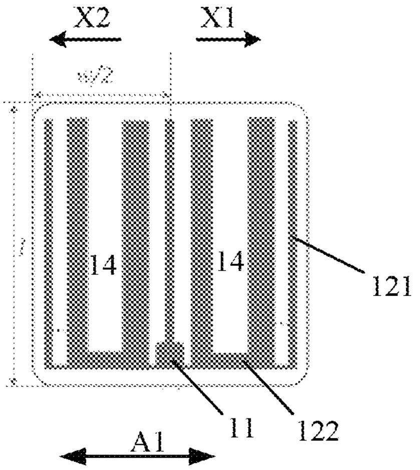

FIGS. 11*a* and 11*b* are schematic diagrams of another semiconductor device according to the second embodiment of the present disclosure. As shown in FIG. 11*a*, in a first direction pointing from the gate pad 11 toward a side away from the gate pad 11 along the first axis A1, widths or thicknesses of the plurality of first portions first decrease and then increase, widths or thicknesses of the plurality of second portions first decrease and then increase, and lengths of the plurality of emitter segments along the first axis first decrease and then increase. As shown in FIG. 11*b*, in the first directions X1, X2, widths or thicknesses of the plurality of first portions 121 first increase and then decrease, widths or thicknesses of the plurality of second portions 122 first increase and then decrease, and lengths of the plurality of emitter segments 14 along the first axis A1 first increase and then decrease.

Figure 12A:
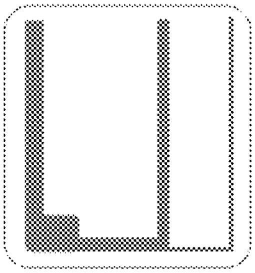
FIGS. 12*a* and 12*b* are schematic diagrams showing a gate pad of the semiconductor device according to the second embodiment of the present disclosure, the gate pad locates at different positions.
Figure 12B:
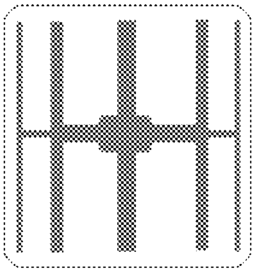

In FIGS. 8, 10, 11*a* and 11*b*, the plurality of second portions 122 are disposed at a first side edge S1 of the semiconductor device, and the gate pad 11 is also disposed in the middle of the first side edge S1. The present disclosure is not limited thereto. The gate pad 11 may also be disposed at a corner of the semiconductor device. As shown in FIG. 12*a*, the gate pad is disposed at a corner of the semiconductor device, in connection with and in contact with the leftmost first and second portions. As shown in FIG. 12*b*, the plurality of second portions are disposed in a middle region of the semiconductor device, the gate pad is also disposed in the middle region of the semiconductor device, and the gate pad is aligned with the plurality of second portions along the first axis. In this case, in a direction from the gate pad to a side away from the gate pad along the first axis (a direction from the gate pad to the right in FIG. 12*a*, and directions from the gate pad to the left and to the right in FIG. 12*b*), widths or thicknesses of the plurality of first portions, widths or thicknesses of the plurality of second portions, and lengths of the plurality of emitter segments along the first axis may gradually change. In FIGS. 12*a* and 12*b*, in a direction from the gate pad to a side away from the gate pad along the first axis (a direction from the gate pad to the right in FIG. 12*a*, and directions from the gate pad to the left and to the right in FIG. 12*b*), widths or thicknesses of the plurality of first portions, widths or thicknesses of the plurality of second portions, and lengths of the plurality of emitter segments along the first axis gradually decrease, but the present disclosure is not limited thereto. Widths or thicknesses of the plurality of first portions, widths or thicknesses of the plurality of second portions, and lengths of the plurality of emitter segments along the first axis may also gradually increase, first increase and then decrease, first decrease and then increase, etc., as long as gate signals arriving at the gates of the plurality of cells are substantially consistent.

As described above, the present disclosure is also not limited to the cases where widths or thicknesses of the plurality of first portions, widths or thicknesses of the plurality of second portions, and lengths of the plurality of emitter segments along the first axis all change in the first direction. At least one of widths or thicknesses of the plurality of first portions, widths or thicknesses of the plurality of second portions, and lengths of the plurality of emitter segments along the first axis may be reasonably designed as long as gate signals arriving at the gates of the plurality of cells are substantially consistent.

Figure 13A:
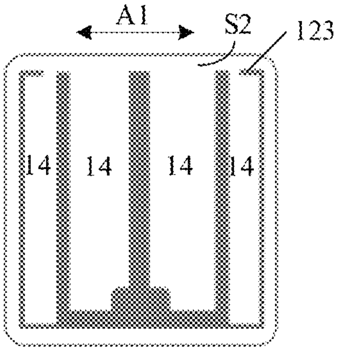
FIGS. 13*a*, 13*b* and 13*c* are schematic diagrams showing the semiconductor device according to the second embodiment of the present disclosure that has a third portion.
Figure 13B:
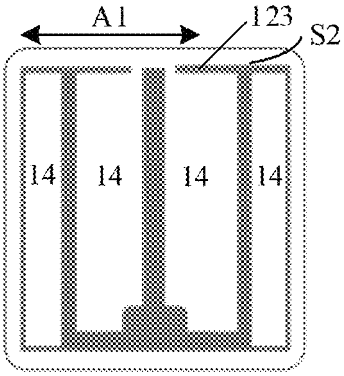
Figure 13C:
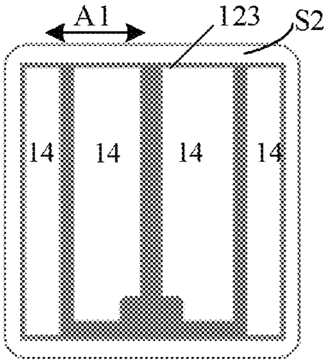

In an embodiment of the present disclosure, as shown in FIGS. 13*a* to 13*c*, the semiconductor device may further include a third portion 123 connected to the plurality of first portions at ends of the plurality of first portions which are not connected to the second portions, and the third portion 123 is disposed along the first axis A1 and located at a second side edge S2 of the semiconductor device. As shown in FIGS. 13*a* and 13*b*, an opening may be provided in the third portion 123 to facilitate interconnection between elements in different emitter segments 14, and between an element in the emitter segment 14 and an element at the gate busbar's periphery (e.g., ground metal). As shown in FIG. 13*c*, the third portion 123 may also completely enclose the plurality of emitter segments.

Figure 14:
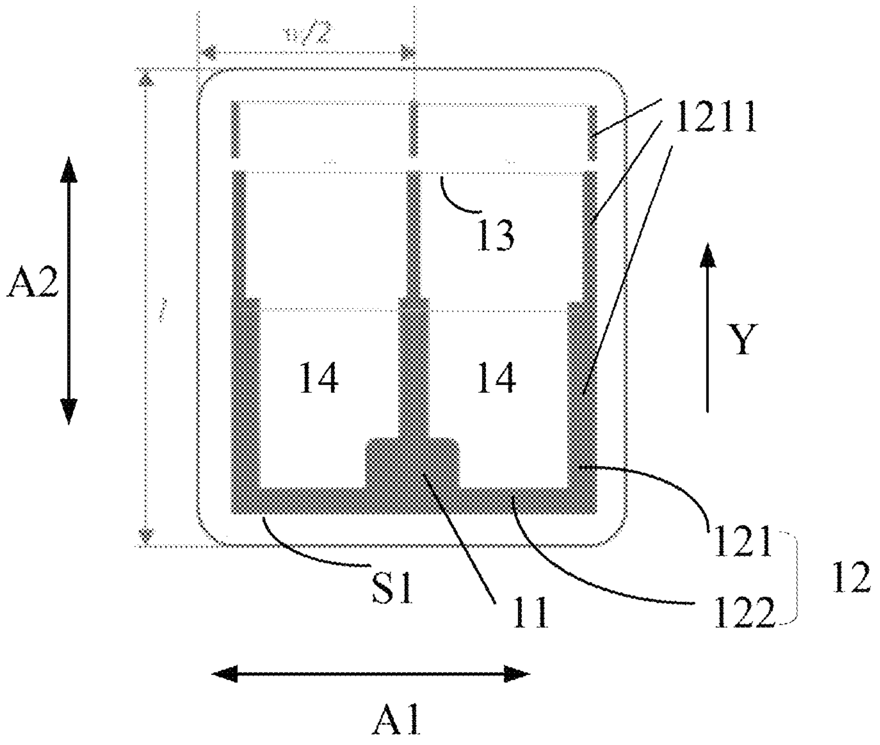
FIG. 14 is a schematic diagram of a semiconductor device according to a third embodiment of the present disclosure.

FIG. 14 is a schematic diagram of a semiconductor device according to a third embodiment of the present disclosure. As shown in FIG. 14, the semiconductor device includes a gate pad 11, a gate busbar 12 and a plurality of trench gates 13. The plurality of trench gates 13 connect the gates (not shown in FIG. 14) of a plurality of cells of the semiconductor device. Each of the trench gates 13 is disposed along a first axis A1. The gate busbar 12 includes a plurality of first portions 121 each disposed along a second axis A2. The plurality of first portions 121 are connected to the plurality of trench gates 13. The first axis A1 intersects with the second axis A2. Similar to the second embodiment shown in FIG. 8, the gate pad 11 is disposed along the first axis A1. The gate busbar 12 further includes a second portion 122 disposed along the first axis A1. The second portion 122 connects the plurality of first portions 121 to the gate pad 11. The plurality of first portions 121 are spaced apart from each other to divide the semiconductor device into a plurality of emitter segments 14. Unlike the second embodiment shown in FIG. 8, each of the first portions 121 includes a plurality of first sub-portions 1211 disposed along the second axis A2 and connected in sequence, and at least one of widths, thicknesses and lengths of the plurality of first sub-portions 1211 change along the second axis. In addition, lengths of the plurality of emitter segments 14 along the first axis A1 may also change with distances of the plurality of emitter segments 14 from the gate pad 11.

In the embodiments of the present disclosure, lengths of the emitter segments along the first axis and the width/thickness of each of the first portions of the gate busbar are designed to ensure that each cell could receive a substantially consistent gate signal. The gate signal difference between the respective cells could be reduced, no matter how far the cells are from the gate pad, which improves the current sharing capability of the chip.

As shown in FIG. 14, the length direction of the semiconductor device is parallel to the second axis A2, and the width direction of the semiconductor device is parallel to the first axis A1.

In an embodiment of the present disclosure, in a second direction parallel to the second axis and pointing toward a side away from the gate pad 11, widths or thicknesses of the plurality of first sub-portions 1211 gradually change and differ from each other, and lengths of the plurality of first sub-portions 1211 gradually change and differ from each other. In FIG. 14, in a second direction Y that parallels to the second axis and points toward a side away from the gate pad 11, widths or thicknesses of the plurality of first sub-portions 1211 gradually decrease, and lengths of the plurality of first sub-portions 1211 gradually decrease.

The implementation of the semiconductor device shown in FIG. 14 will be described in detail below.

Figure 15:
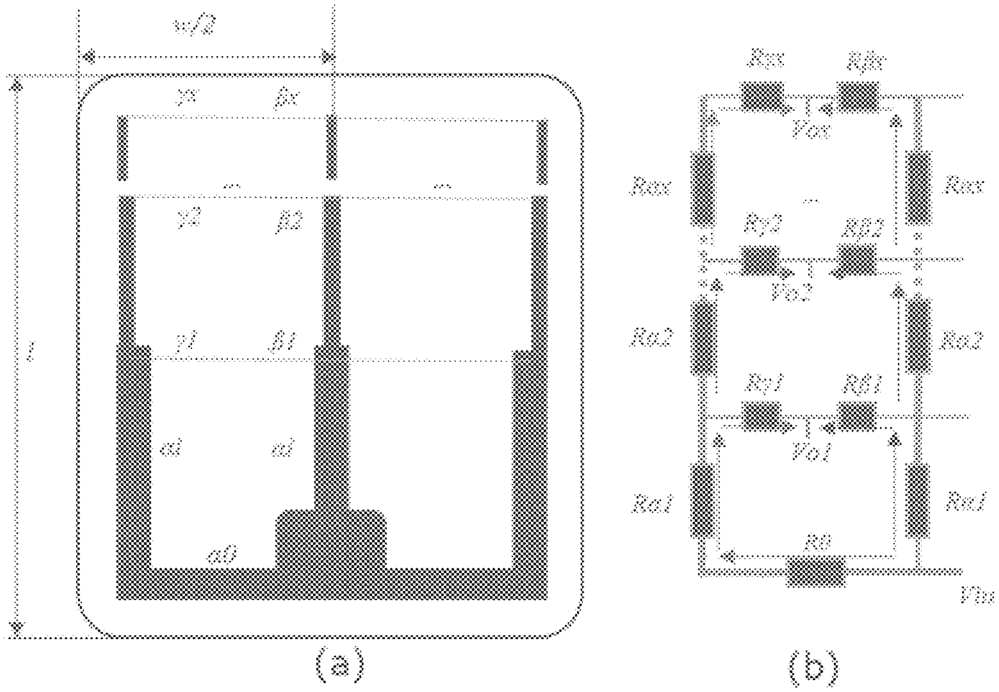
FIG. 15 is an equivalent circuit diagram of the semiconductor device shown in FIG. 14.

FIG. 15 is an equivalent circuit diagram of the semiconductor device shown in FIG. 14. As shown in FIG. 15, in order to ensure that gate signals arriving at the gates of the respective cells are the same:

$$\sum_{i=1}^{x} V_{\alpha i} + v_{\beta x} = V_0 + \sum_{i=1}^{x} V_{\alpha i} + v_{\gamma x},$$

Where V denotes the voltage of the gate busbar while v denotes the voltage of the trench gate. Specifically, $V_{\alpha i}$ denotes the voltage of the $i^{th}$ first sub-portion in the second direction, $V_0$ denotes the voltage of the second sub-portion between adjacent first sub-portions, and $v_{\beta x}$ and $v_{\gamma x}$ denote the voltages of the trench gates from two adjacent first sub-portions to the gate therebetween, respectively.

In the equivalent circuit diagram of FIG. 15, the following conditions are satisfied:

voltage: $v_{\beta i}=V_{\alpha(i+1)}+v_{\beta(i+1)}$.

length: $\Sigma L_{\alpha i}=l$, $L_{\gamma i}+L_{\beta i}=w/2$, current: $I_{\alpha i}=I_{\alpha(i+1)}+i_{\beta i}*2*L_{\alpha i}/\text{pitch}$, $I_{\alpha i}=I_{a(i+1)}+i_{\gamma i}*L_{\alpha i}/\text{pitch}$.

Under the above conditions, if the design conditions $I>L_{\alpha i}>L_{\alpha(i+1)}>=0$, $W_{\beta i}>W_{\beta(i+1)}$ are satisfied, the following results could be obtained:

taking three first sub-portions (x=3) as an example, if $W_{\alpha 3}>=5$ μm, $L_{\beta i}=(0.5\sim 1)*(w/2))$, the following could be obtained:

$L_{\alpha 1}=(0.3\sim 0.7)*I$, $L_{\alpha 2}=(0.2\sim 0.5)*I$, $L_{\alpha 3}=(0\sim 0.3)*I$;

$W_{\alpha 1}=(1\sim 15)*W_{\alpha 3}$, $W_{\alpha 2}=(1\sim 8)*W_{\alpha 3}$

Figure 16:
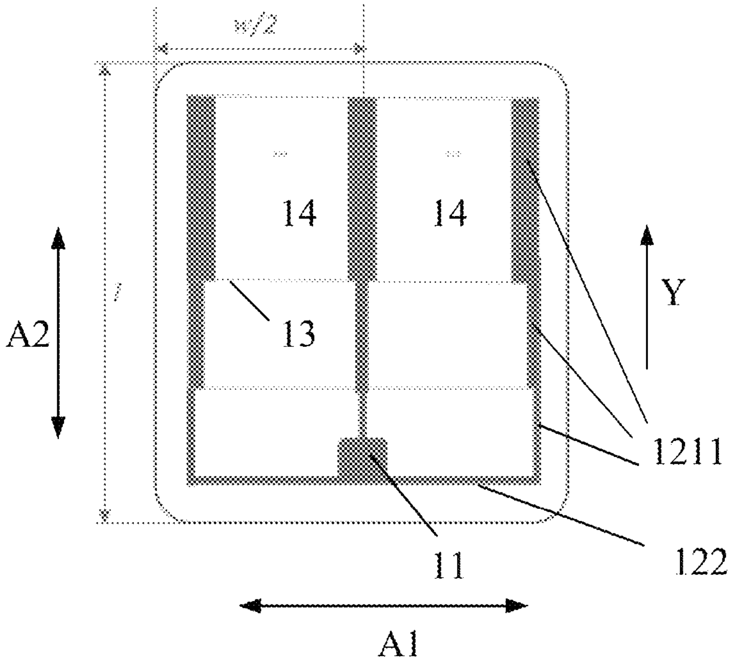
FIG. 16 is a schematic diagram of another semiconductor device according to the third embodiment of the present disclosure.

FIG. 16 is a schematic diagram of another semiconductor device according to the third embodiment of the present disclosure. As shown in FIG. 16, in a second direction Y parallel to the second axis A2 and pointing toward a side away from the gate pad 11, widths or thicknesses of the plurality of first sub-portions 1211 gradually increase, and lengths of the plurality of first sub-portions 1211 gradually increase.

Figure 17A:
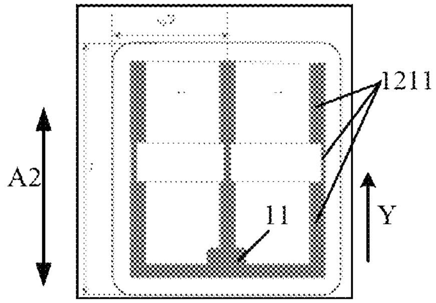
FIGS. 17*a* and 17*b* are schematic diagrams of another semiconductor device according to the third embodiment of the present disclosure.
Figure 17B:
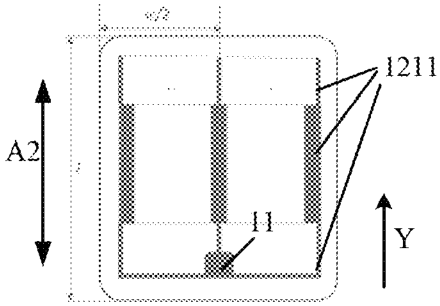

FIGS. 17*a* and 17*b* are schematic diagrams of another semiconductor device according to the third embodiment of the present disclosure. As shown in FIG. 17*a*, in a second direction Y parallel to the second axis A2 and pointing toward a side away from the gate pad 11, widths or thicknesses of the plurality of first sub-portions 1211 first decrease and then increase, and lengths of the plurality of first sub-portions 1211 first decrease and then increase. As shown in FIG. 17*b*, in the second direction Y parallel to the second axis A2 and pointing toward a side away from the gate pad 11, widths or thicknesses of the plurality of first sub-portions 1211 first increase and then decrease, and lengths of the plurality of first sub-portions 1211 first increase and then decrease.

Figure 18A:
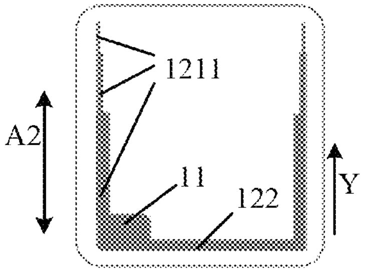
FIGS. 18*a* and 18*b* are schematic diagrams showing that a gate pad of the semiconductor device according to the third embodiment of the present disclosure is located at different positions.
Figure 18B:
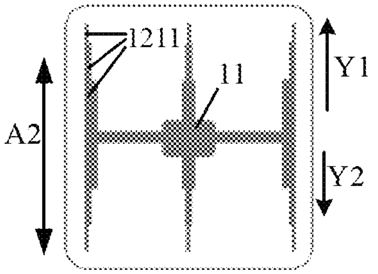

In FIGS. 14, 16, 17*a* and 17*b*, the second portion 122 is disposed at a first side edge S1 of the semiconductor device, and the gate pad 11 is also disposed in the middle of the first side edge S1. The present disclosure is not limited thereto. The gate pad 11 may also be disposed at a corner of the semiconductor device. As shown in FIG. 18*a*, the gate pad is disposed at a corner of the semiconductor device, for which the gate pad is in connection with and in contact with the second portion and the leftmost first portion. As shown in FIG. 18*b*, the second portion is disposed in a middle region of the semiconductor device, the gate pad is also disposed in the middle region of the semiconductor device, and the gate pad is aligned with the second portion along the first axis. In this case, in a direction from the gate pad to a side away from the gate pad along the second axis (a direction upward from the gate pad in FIG. 18*a*, and directions upward and downward from the gate pad in FIG. 18*b*), widths or thicknesses of the plurality of first sub-portions 1211 gradually change, and lengths of the plurality of first sub-portions 1211 gradually change. In FIGS. 18*a* and 18*b*, in a direction from the gate pad 11 to a side away from the gate pad 11 along the second axis A2 (a direction Y upward from the gate pad in FIG. 18*a*, a direction Y1 upward from the gate pad and a direction Y2 downward from the gate pad in FIG. 18*b*), widths or thicknesses of the plurality of first sub-portions 1211 and lengths of the plurality of first sub-portions 1211 gradually decrease, but the present disclosure is not limited thereto. Widths or thicknesses of the plurality of first sub-portions 1211 and lengths of the plurality of first sub-portions 1211 may gradually increase, first increase and then decrease, first decrease and then increase, etc., as long as gate signals arriving at the gates of the plurality of cells are substantially consistent.

In the embodiments of the present disclosure, at least one of widths or thicknesses of the plurality of first sub-portions, lengths of the plurality of first sub-portions, and lengths of the plurality of emitter segments along the first axis may be reasonably designed so that gate signals arriving at the gates of the plurality of cells are substantially consistent.

Figure 19A:
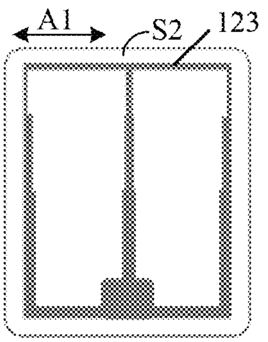
FIGS. 19*a*, 19*b*, and 19*c* are schematic diagrams showing the semiconductor device according to the third embodiment of the present disclosure that has a third portion.
Figure 19B:
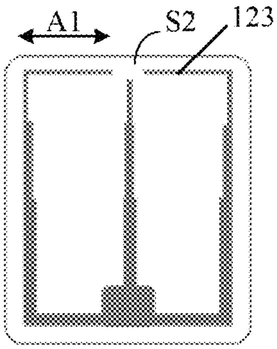
Figure 19C:
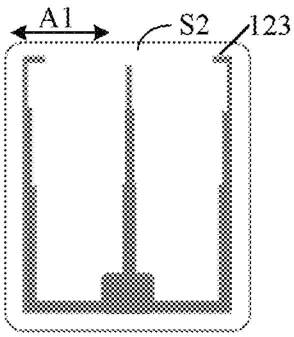

As shown in FIGS. 19*a* to 19*c*, the semiconductor device may further include a third portion 123 connected to the plurality of first portions at ends of the plurality of first portions which are not connected to the second portion, and the third portion 123 is disposed along the first axis A1 and located at a second side edge S2 of the semiconductor device. As shown in FIGS. 19*b* and 19*c*, an opening may be provided in the third portion 123 to facilitate interconnection between elements in different emitter segments, and between an element in the emitter segment and an element at the gate busbar's periphery (e.g., ground metal). As shown in FIG. 19*a*, the third portion 123 may also completely enclose the plurality of emitter segments.

Figure 20A:
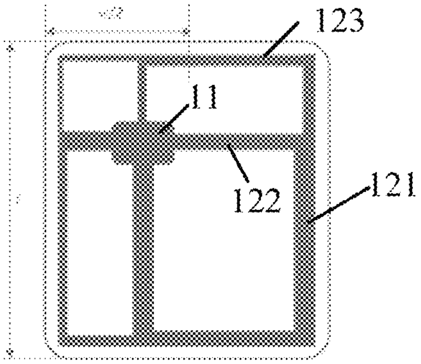
FIGS. 20*a* and 20*b* are schematic diagrams showing that the semiconductor device according to the third embodiment of the present disclosure is divided into emitter segments having different lengths and widths by a plurality of first portions, a second portion and a third portion.
Figure 20B:
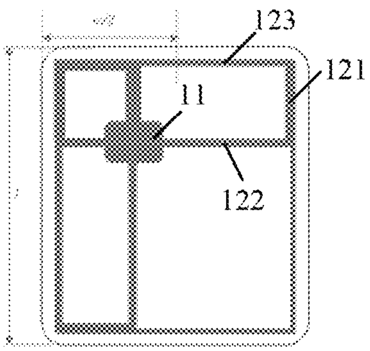

In an embodiment of the present disclosure, as shown in FIGS. 20*a* and 20*b*, the second portion 122 is disposed in an middle region of the semiconductor device, the gate pad 11 is also disposed in the middle region of the semiconductor device, the gate pad 11 is aligned with the second portion 122 along the first axis, the semiconductor device further includes a third portion 123 connected to the plurality of first portions at both ends of the plurality of first portions which are not connected to the second portions, and the third portion 123 is disposed along the first axis A1 and located at two opposite side edges of the semiconductor device. The plurality of emitter segments 14 are defined by the plurality of first portions 121, the second portion 122 and the third portion 123, and the plurality of emitter segments 14 have different lengths along the first axis and different widths along the second axis.

Figure 21:
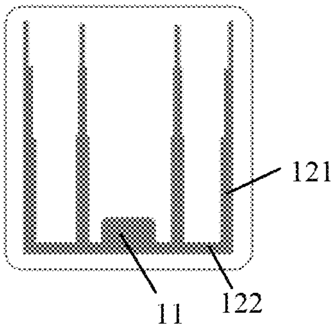
FIG. 21 is a schematic diagram of another semiconductor device according to the third embodiment of the present disclosure.

It could be understood that the gate pad 11 may be disposed in connection with and in contact with only the second portion 122, instead of the first portions 121, as shown in FIG. 21.

Figure 22A:
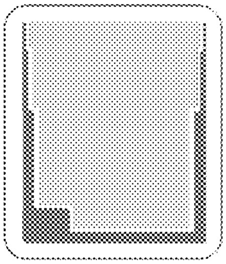
FIGS. 22*a* and 22*b* are schematic diagrams showing interconnection between emitters within a same emitter segment.
Figure 22B:
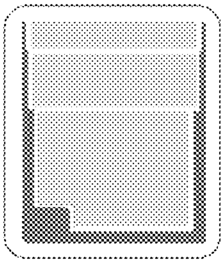

Within a same emitter segment, the emitters may be physically interconnected, as shown in FIG. 22*a*, or independent of each other, as shown in FIG. 22*b*.

Finally, it should be noted that the above embodiments are only used to illustrate, rather than limit, the technical solutions of the present disclosure. Although the present disclosure has been described in detail with reference to the above embodiments, a person of ordinary skill in the art should understand that: the technical solutions recited in the above embodiments could be modified, or some or all of the technical features thereof could have equivalent substitutions, for example, the features of the dependent claims could be freely replaced and/or combined as required, and these modifications or substitutions do not essentially make the corresponding technical solutions depart from the scope of the technical solutions of the embodiments in the present disclosure.

LIST OF REFERENCE NUMERALS

| Component(s) | Reference numeral(s) |
|---|---|
| Gate pad | 11 |
| Gate busbar | 12 |
| First portion | 121 |
| First sub-portion | 1211 |
| Second portion | 122, 122a, 122b |
| Third portion | 123 |
| Trench gate | 13 |
| Emitter segment | 14 |
| First axis | A1 |
| Second axis | A2 |
| First direction | X, X1, X2 |
| Second direction | Y, Y1, Y2 |
| First side edge | S1 |
| Second side edge | S2 |
| Third side edge | S3 |
| Fourth side edge | S4 |

What is claimed is:

1. A semiconductor device having a plurality of cells, wherein each of the plurality of cells comprises a gate, the semiconductor device comprising a gate pad;

a gate busbar; and a plurality of gate lines, wherein the gate busbar connects the gate pad to the plurality of gate lines, wherein the plurality of gate lines connects the gate busbar to the gates of the plurality of cells, and wherein each of the plurality of gate lines is disposed along a first axis, wherein the gate busbar comprises a plurality of first portions each disposed along a second axis and at least one second portion disposed along the first axis, wherein the second axis intersects with the first axis, and wherein the plurality of first portions are spaced apart from each other, and wherein each of the plurality of first portions comprises a plurality of first sub-portions, and lengths of the plurality of first sub-portions and widths or thicknesses of the plurality of first sub-portions change with respective distances thereof from the gate pad, so that gate signals arriving at the gates of the plurality of cells from the gate pad via the gate busbar and the plurality of gate lines are consistent.

2. The semiconductor device of claim 1, wherein the plurality of first sub-portions are disposed along the second axis and connected in sequence, wherein lengths of the plurality of first sub-portions and widths or thicknesses of the plurality of first sub-portions change in a second direction, and wherein the second direction parallels to the second axis and points toward a side away from the gate pad.

3. The semiconductor device of claim 2, wherein the widths or thicknesses of the plurality of first sub-portions gradually decrease in the second direction, and wherein the lengths of the plurality of first sub-portions along the second axis gradually decrease in the second direction.

4. The semiconductor device of claim 2, wherein the widths or thicknesses of the plurality of first sub-portions gradually increase in the second direction, and wherein the lengths of the plurality of first sub-portions along the second axis gradually increase in the second direction.

5. The semiconductor device of claim 2, wherein the widths or thicknesses of the plurality of first sub-portions first increase and then decrease in the second direction, and wherein the lengths of the plurality of first sub-portions along the second axis first increase and then decrease in the second direction.

6. The semiconductor device of claim 2, wherein the widths or thicknesses of the plurality of first sub-portions first decrease and then increase in the second direction, and wherein the lengths of the plurality of first sub-portions along the second axis first decrease and then increase in the second direction.

7. The semiconductor device of claim 1, wherein the at least one second portion connects the plurality of first portions to the gate pad.

8. The semiconductor device of claim 2, wherein the at least one second portion connects the plurality of first portions to the gate pad.

9. The semiconductor device of claim 3, wherein the at least one second portion connects the plurality of first portions to the gate pad.

10. The semiconductor device of claim 4, wherein the at least one second portion connects the plurality of first portions to the gate pad.

11. The semiconductor device of claim 5, wherein the at least one second portion connects the plurality of first portions to the gate pad.

12. The semiconductor device of claim 6, wherein the at least one second portion connects the plurality of first portions to the gate pad.

13. The semiconductor device of claim 7, wherein the at least one second portion has a uniform width along the first axis.

14. The semiconductor device of claim 7, wherein the gate pad is located at a position selected from the group consisting of a corner, a middle of a side edge, and a middle region of the semiconductor device.

15. The semiconductor device of claim 7, wherein the gate pad is located in a middle region of the semiconductor device, wherein the gate busbar further comprises at least one third portion connected to ends of adjacent first portions at an edge of the semiconductor device, and wherein each third portion is disposed along the first axis.

16. The semiconductor device of claim 7, wherein the gate busbar further comprises a third portion connected to ends of the first portions at a side edge of the semiconductor device extending along the first axis.

17. The semiconductor device of claim 15, wherein the third portion has a width that changes along the first axis.

18. The semiconductor device of claim 16, wherein the third portion is provided with an opening.

* * * * *